United States Patent [19]

Hed

[11] Patent Number: 5,228,923
[45] Date of Patent: Jul. 20, 1993

[54] CYLINDRICAL THERMOELECTRIC CELLS
[75] Inventor: Aharon Z. Hed, Nashua, N.H.
[73] Assignee: Implemed, Inc., Brookline, Mass.
[21] Appl. No.: 626,986
[22] Filed: Dec. 13, 1991
[51] Int. Cl.$^5$ .................................... H01L 35/28
[52] U.S. Cl. .................... 136/208; 136/203; 136/204; 136/205; 136/209; 136/210; 136/224; 136/225; 62/3.2; 62/3.3
[58] Field of Search ............... 136/203, 204, 205, 208, 136/209, 210, 224, 225; 62/3.2, 3.3

[56] References Cited

U.S. PATENT DOCUMENTS

| | | | |
|---|---|---|---|
| 2,919,553 | 1/1960 | Fritts | 62/3 |
| 2,959,925 | 11/1960 | Frantti et al. | 62/3 |
| 2,996,889 | 8/1961 | Roeder, Jr. | 62/3 |
| 3,004,393 | 10/1961 | Alsing | 62/3 |
| 3,054,840 | 9/1962 | Alsing | 136/4 |
| 3,097,027 | 7/1963 | Mims | 308/189 |
| 3,127,749 | 4/1964 | Berguall et al. | 62/3 |
| 3,150,656 | 9/1964 | Huber | 126/110 |
| 3,197,342 | 7/1965 | Neild, Jr. | 136/4 |
| 3,212,275 | 10/1965 | Tillman, Jr. | 62/3 |
| 3,269,872 | 8/1966 | Thompson | 136/208 |
| 3,291,647 | 12/1966 | Schneider et al. | 136/204 |
| 3,400,452 | 9/1968 | Emley | 29/573 |
| 3,481,794 | 12/1969 | Kasschau | 136/208 |
| 3,794,527 | 2/1974 | Kim | 136/208 |
| 3,879,229 | 4/1975 | Gilbert | 136/208 |
| 4,011,104 | 3/1977 | Basiulis | 136/205 |
| 4,056,406 | 11/1977 | Markman et al. | 136/208 |
| 4,095,998 | 6/1978 | Hanson | 136/208 |
| 4,182,129 | 1/1980 | Haunold et al. | 62/3 |

Primary Examiner—Donald P. Walsh
Assistant Examiner—Chrisman D. Carroll
Attorney, Agent, or Firm—Eliot S. Gerber

[57] ABSTRACT

A thermoelectric device has a cylindrical structure with a hollow central annulus member in which a fluid is pumped so that the heated fluid is pumped from the center of the structure and discharged on the outer surface of an outer annulus member or with the reversal of electrical current, the heated fluid is pumped from the outer periphery and discharged in the central tube. A plurality of thermoelectric cells are positioned in the space between the inner and outer annulus members with the cells being radially directed relative to the axis of the inner annulus member. A thermoelectric device having a similar structure may be used for the conversion of thermal energy to electrical energy when a thermal gradient is imposed between the inner member of the structure and the peripheral surface.

16 Claims, 10 Drawing Sheets

CYLINDRICAL THERMOELECTRIC CELLS

BACKGROUND OF THE INVENTION

1. Field of the Invention

The present invention relates to energy conversion devices and more particularly to thermoelectric cells.

2. Related Art

Thermoelectric cells are well known in the prior art, for the conversion of electric power to heat or to convert heat to electric power. These cells, whose operation is based on the Seebeck effect or the Peltier effect, are used in their simplest form to measure temperature (as in many thermocouples) and in more complex structures to pump heat between a cold and hot reservoir, when an external electrical power is supplied, or to generate electrical power when an external thermal gradient is provided.

An elementary thermocouple consists of two dissimilar materials connected electrically at one end and having a thermal gradient between their connected ends and their respective opposing ends. Such a thermal gradient induces a voltage which varies with the thermal gradient imposed and depends on the relative electronic properties of the materials of the thermocouple (the Seebeck effect). Conversely, when a voltage is applied to the thermocouple it causes a thermal gradient to appear whose direction depends on the polarity of the applied voltage (the Peltier effect). Heat pumps using the thermoelectric effect usually involve two different semiconductor materials, one a p-type semiconductor (conductivity due to positive charge carriers or holes) and the other an n-type semiconductor (current carried by negative charge carriers or electrons). It is preferred that these semiconductors are capable of sustaining a large thermal gradient and therefore materials having low thermal conductivity are chosen. Typical materials used in thermoelectric cells are bismuth telluride (p and n type), lead telluride and various alloys of silicon and germanium.

When the thermoelectric cells are used as heat pumps or to transfer heat from a cold reservoir to a warmer reservoir, several thermocouples ("couple") are connected in series. Namely, the hot end of the p "leg" of one couple is connected to the hot end of the n "leg" of the next couple. Since all the cells are equal in composition, and dimensions, the voltage drop on each couple is the same (the total voltage divided by the number of cells) and a single thermal gradient is developed on the assembly between the cold junctions (between each pairs' cold legs) and the hot junctions (between neighboring pairs). Examples of such products are well known in the prior art and available for instance from Thermoelectron Corporation of Waltham Mass.

In the prior art, thermoelectric cells for heat pumps and for power generation units have been built in a planar geometry. Namely a multiplicity of thermoelectric cells are assembled between two planes with all the intercouple junctions on one plane and all the intracouple (between the two members of a couple) junctions on the opposing plane. Heat is transferred from one plane to the other plane when an appropriate DC voltage is applied to the assembly. The maximum temperature gradient achievable with a given couple depends on the properties of materials used in the couple. The temperature gradient of such planar devices can be further increased by cascading a number of devices in series thermally (but insulated electrically), so that the hot side of one device serves as the thermal cold side of the next device in the cascade. The heat pumping capacity can be increased by connecting additional devices thermally in parallel.

The planar structure of the thermoelectric cells of the prior art imposes a limitation on the quantity of heat that can be extracted through the cells' cold face. With a given type of thermocouple, and within the limitations imposed by maximum current that can be passed through such couples, only an increase in the cold surface area (and thus additional thermocouples) can increase the rate of heat extraction from the cold reservoir. Thus, when the device to be cooled is relatively small, and the heat that needs to be extracted from that device is large, a thermoelectric cell cannot be used. Furthermore, in a number of applications it is desired to cool a cylindrical core, for instance, laser rods or other cylindrical laser assemblies. In yet other applications it might be desired to heat a central solid core, or to heat or cool fluid flowing within a hollow core. All these cannot be satisfactorily achieved with the current state of the art thermoelectric cells.

SUMMARY OF THE INVENTION

In the instant invention a plurality of thermoelectric cells are positioned circumferentially on an inner cylinder so that all the intracouple junctions are on the base of the inner cylinder and all the intercouple junctions are on an outer cylinder.

When a voltage is applied in one direction, the inner surface of the inner cylinder (inner core) cools off and heat is withdrawn from the core and rejected at the periphery (the outer surface of the outer cylinder). When the voltage is applied in the reverse direction, heat is pumped into the inner core. This configuration allows for a number of novel thermoelectric devices. For instance, a number of cylindrical cells can be assembled side by side on a long cylindrical structure in which fluid flows through the inner cylinder (inner core) and is cooled, resulting in a cold tip at the distal end of the structure. Since the quantity of heat extracted from the liquid is proportional to the length of the structure (or the area of the cylindrical structure inner surface) and this length can be made large relative to the cell's diameter, the flowing liquid can be used as a heat exchange medium to produce very cold tips which may be used to cool very small devices.

One of the major shortcomings of current state of the art thermoelectric cells is that the heat pumping power of the cells is a strong declining function of the thermal gradient on the thermocouples within the cell, as a result thermoelectric cells are not widely used in commercial and consumer applications. When designing a refrigerator having a multiplicity of cylindrical thermoelectric cells of the instant invention using a heat exchanging fluid, the thermal gradient on each cell can be maintained at a minimal value or essentially zero, thus operating the thermoelectric devices at their peak efficiency and making them competitive with chlorinated fluorocarbon based refrigerators and heat pumps. Other applications and advantages of the instant invention will become further apparent from the following detailed description of the invention.

OBJECTIVES OF THE INVENTION

It is the primary object of the instant invention to provide a cylindrically shaped thermoelectric cell having a plurality of thermocouples.

It is another object of the present invention to provide a thermoelectric cell having a hollow center and an outer periphery so that the cell may be a heat pump removing heat from the inner hollow center to its outer periphery, or may be used in the reverse direction of heat flow.

It is yet another object of the instant invention to provide an assembly of such cells assembled side by side on a common hollow structure in which a heat exchange fluid flows within the hollow center and returns in a path between the periphery and an external cylindrical structure essentially concentric with the cell, to provide optimal heat removal at the distal end of the cell.

It is yet another object of the instant invention to increase the efficiency of a multi-element thermoelectric refrigerator by operating each thermocouple of the device at a minimal thermal gradient.

It is yet another object of the instant invention to provide a multi-element thermoelectric device capable of efficiently extracting low grade heat (150° F. to 500° F.) from a fluid and converting such heat to electricity.

It is yet another object of the instant invention to provide a multi-element cylindrical thermoelectric device which generates electricity relatively more efficiently than the planar thermoelectric cells.

BRIEF DESCRIPTION OF THE DRAWINGS

FIGS. 10A-10I are cross-sections of FIG. 10J which

DESCRIPTION OF THE PREFERRED EMBODIMENTS OF THE INVENTION

Figure 1:
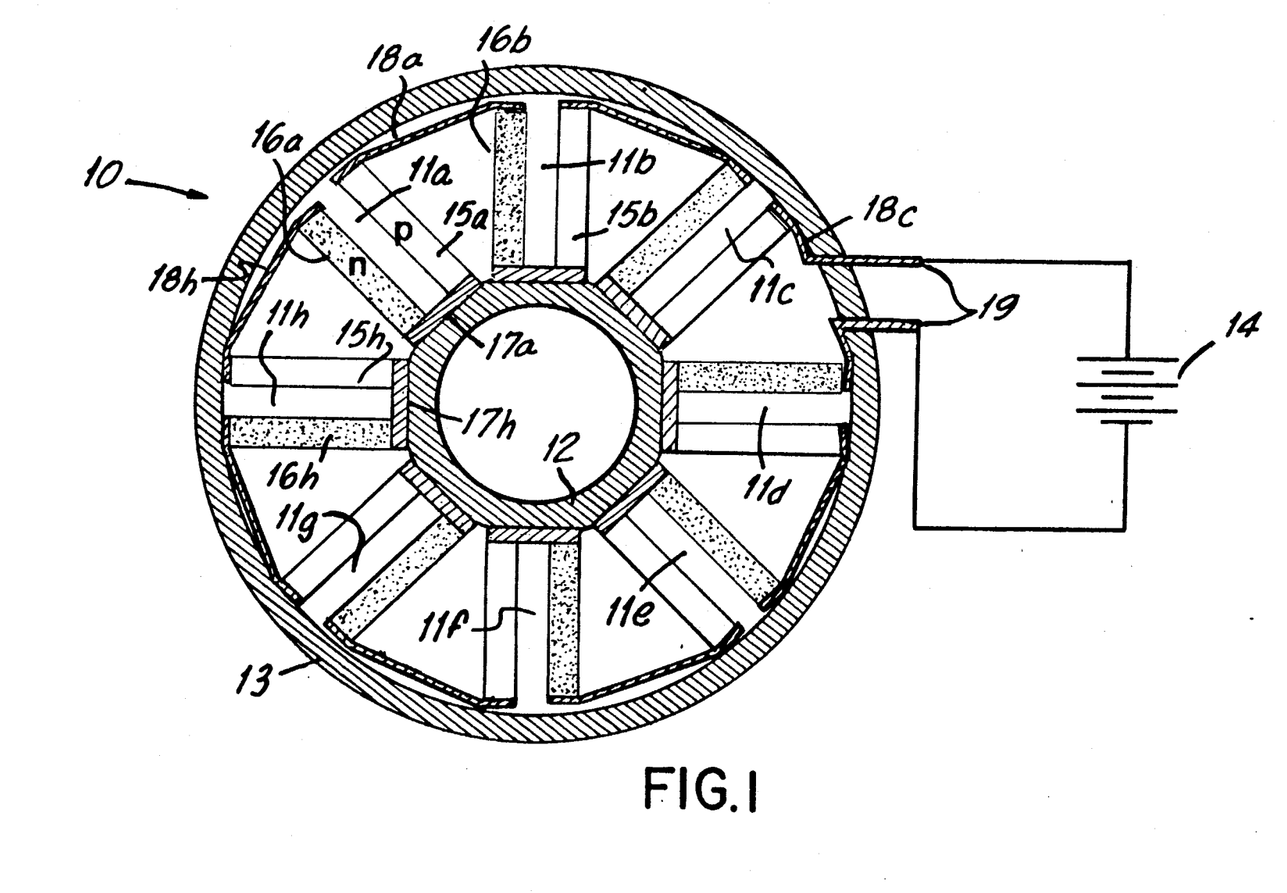
FIG. 1 is a cross section through a cylindrical thermoelectric cell of the instant invention.

FIG. 1 shows a cross section through a thermoelectric cell 10 of the instant invention. In the following discussion it is assumed that the cold side of the couples (thermocouples) 11 (11a–11h) points toward the inner annulus 12 (inner core, tube or cylinder) of the cylindrical cell 10 and the warm side is in contact with the external retaining annulus 13. However, by reversing the polarity of the DC power source 14 (shown as a battery) the direction of heat flow and thus of the thermal gradient on each couple 11 will be reversed as well.

Each couple 11 (11a–11h) consists of two dissimilar elements, the p-type leg 15 (15a–15h) and the n-type leg 16 (16a–16h). The two elements of the couple 11 are electrically connected at their cold side with a conductor 17 (17a–17h) and the hot side of the p-type leg 15 is electrically connected via another conductor 18 (18a–18h) to the hot end side of the n-type leg 16 of a neighboring couple 11. Similarly the hot side of the n-type leg 16 of the couple 11 is electrically connected to the hot side of the p-type leg 15 of the other neighboring couple 11 by conductor 18. This arrangement continues between all neighboring couples except that at couple 11c the circuit is broken to allow connection to the power source 14 via a pair of electrodes 19 (wires). When DC power is applied to the electrodes 19, a current passes through all the couples, and since the couples are electronically equivalent (same materials and dimensions), the voltage of the power supply is equally distributed between the couples. The central support annulus 12 and the external retaining annulus 13, are both made of heat conductive and electrically insulating materials. Alternatively, the cold and hot electrodes 17 and 18 are coated with a thin insulation to maintain the voltage differential between the various couples in the assembly and the annuli 12 and 13 are metal. The space between the insulating annulus 12 and annulus 13 made of metal, which is not occupied by the couples, can be evacuated, left with ambient air or filled with a dielectric thermally insulating substance, for instance an epoxy, or a liquid, for example a trimethylsiloxy terminated polydimethylsiloxane (available as "PS040" TM from Petrach Systems, Bristol, Pa.).

Figure 2A:
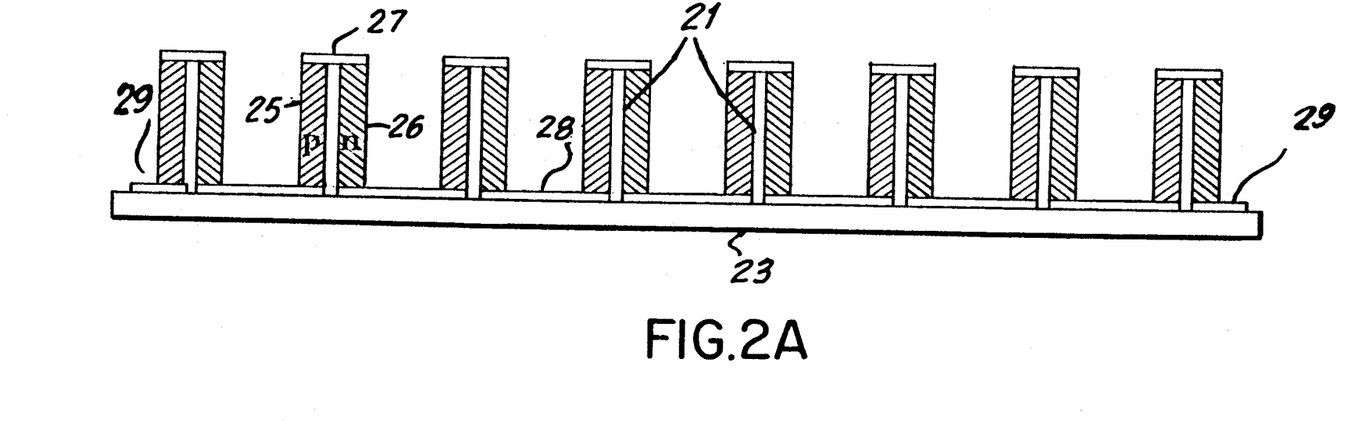
FIGS. 2A and 2B are cross-sections showing certain details of the structure of the cylindrical thermoelectric cell prior to assembly into cylindrical modules

For temperatures near ambient, the inner and outer annuli 12 and 13 preferably made from a suitable insulating plastic material. When manufacturing such a cell, the elements of the couples are preferably assembled on a flexible substrate which is later deformed to form a cylindrical structure as described in FIG. 2. FIG. 2A shows a number of identical couples 21, each the two legs are connected electrically with each other by conductors 27 and the couples are connected in series with each leg in one couple connected to the opposing leg of the neighboring couple by electrical connections 28. These connections, for example of copper, are preferably deposited on the flexible plastic substrate 23 or made from thin and flexible metallic (copper) conductors fastened on the substrate 23. The opposing end elements are terminated with electrodes 29 allowing connection of the assembly to a power supply. By deforming the substrate 23 into a cylindrical structure a cell is obtained as described in connection with FIG. 1. Depending on the application and desired structure, the substrate 23 may be the external annulus 13 or the internal annulus 12.

Figure 2B:
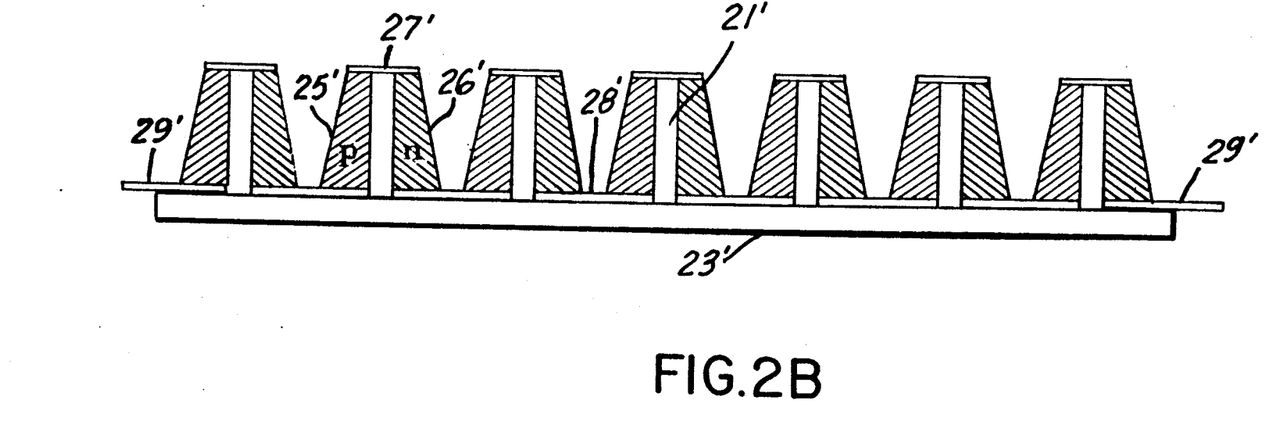

In FIG. 2b a similar structure is shown as in FIG. 2A, except the legs have a cross section which increases in the direction of increasing temperature, when the high temperature side of the cell is the external periphery of the cell. This geometry allows for somewhat more efficient operation of the cell.

Axial structures as described herein with less symmetry, for instance, cylindrical structures having polygonal cross sections, or even partially elliptical are feasible as well.

For higher temperatures, appropriate structural metals for the inner and outer annuli are preferred and are coated with insulation at their point of contact with the electrodes 17 and 18. Alternatively annuli 12 and 13 may be of ceramic, like alumina or aluminum nitride (for good thermal conductivity). In this case alternative assembly methods are used, including fastening of each individual element on the inner annulus and sleeving the external annulus onto the assembly.

The operation of the cell is as follows. When an appropriate DC voltage is applied to the assembly, heat is withdrawn from the inner face of the annulus 12 and is transferred to the outer periphery of the annulus 13. Reversal of the voltage's polarity reverses the direction of heat flow. One difference between the cell of the present invention and thermoelectric cells of the prior art is that heat flow is axially symmetric, i.e. radially inward or outward in relation to the axis, while in the prior art heat flow is unidirectional between parallel planes.

Figure 3A:
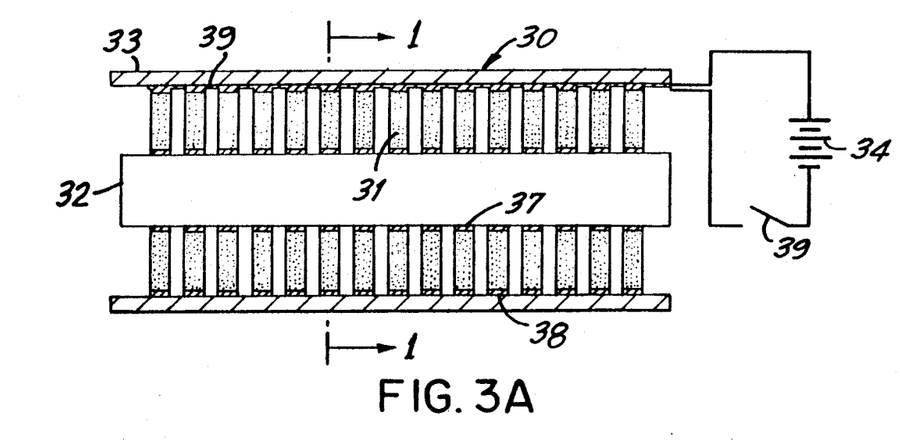
FIGS. 3A and 3B are side cross-sectional views showing assemblies of cylindrical thermoelectric cells in different thermoelectric refrigerators.

Another embodiment of the instant invention is described in FIG. 3A. This figure shows a cross section through an axial refrigerator 30. The cross section A—A through a cylindrical thermoelectric cell 31 and perpendicular to the plane of FIG. 3 is as described in FIG. 1, for a single thermoelectric cell of the instant invention, or can take the shape of topologically equivalent polygonal structures. As shown in FIG. 3A, a large number of the thermoelectric cells 31 described in FIG. 1 are assembled side by side on the core 32, with the cold intercouple junctions electrical contacts 37 on the core side and the hot intracouple contacts 38 on the bracing structure 33 side. The core can be a solid element to be cooled or a hollow structure within which resides the cold thermal load. Each of the thermoelectric cells is terminated with two electrodes (see 19 in FIG. 1) and are connected in parallel, but within each cell the couples are connected in series. This configuration is only for the convenient assembly of the particular device in FIG. 3. This parallel wiring allows for two parallel (only one shown in FIG. 3) metallizations 39, within the bracing cylinder 33 to make contact with each of the respective electrodes (19 in FIG. 1) of the cells 31. FIGS. 4B and 4C show other alternative wiring diagrams which allow more flexibility in the choice of a power source. When the DC power supply 34 powers the assembly by closing the switch 36, the same voltage is applied to all cells 31 and heat is withdrawn from the core 32. Because of the configuration chosen the temperature gradient on the individual legs is essentially the same in all the legs of the assembly and the core cools homogeneously (except for edge effects).

Figure 6A:
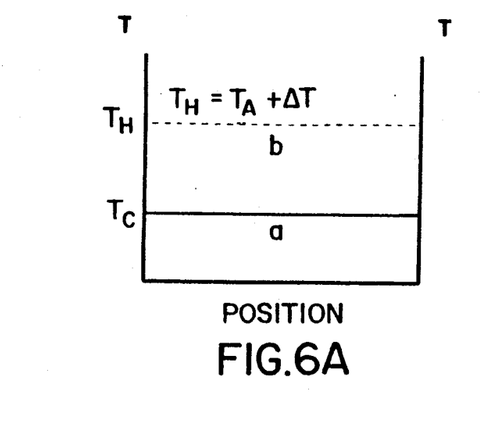
FIGS. 6A-6F are graphs showing the steady state temperature distribution in various devices of the instant invention.

This device is particularly useful when it is desired to cool a cylindrical structure by withdrawing heat radially, for example to cool a laser rod. The temperature distribution in this device is depicted schematically in FIG. 6A. The temperatures in the cooled core (solid line a) and the periphery (broken line b) reach steady state levels of $T_C$ and $T_A$+Delta T respectively, where $T_C$ is the thermal load's temperature and Delta T is an increment above ambient $T_A$ which allows for heat dissipation by radiation to the environment.

Figure 6B:
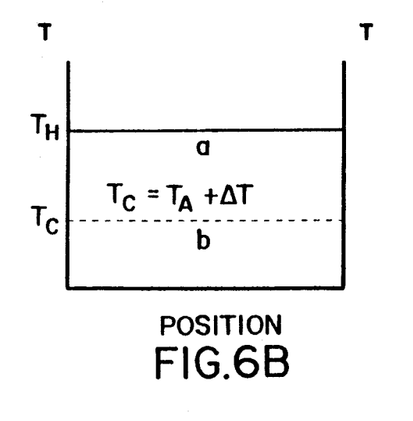
Figure 6C:
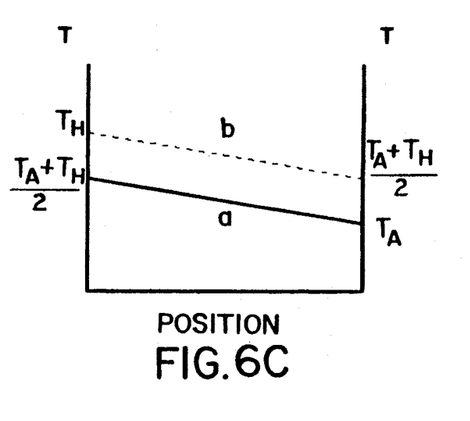

The device of FIG. 3A can also be used to convert thermal energy to electricity i.e. a solid state generator. In this case the fuel can be used to heat the internal core and the D.C. power is removed at the electrodes. For example the cell may directly power an electrical device, or with an appropriate circuit, may charge a battery. This configuration is particularly suitable for converting heat energy from nuclear fuel rods in space based applications, where steam driven generators are not possible. The temperature distribution in this device is depicted schematically in FIG. 6B. The temperatures in the hot core (solid line 1) and the periphery (broken line b) reach steady state levels of $T_H$ and $T_C=T_A+$Delta T respectively, where Delta T is an increment above ambient $T_A$ which allows for heat dissipation by radiation to the environment, and thus maintenance of the thermal gradient which operates the generator.

Figure 3B:
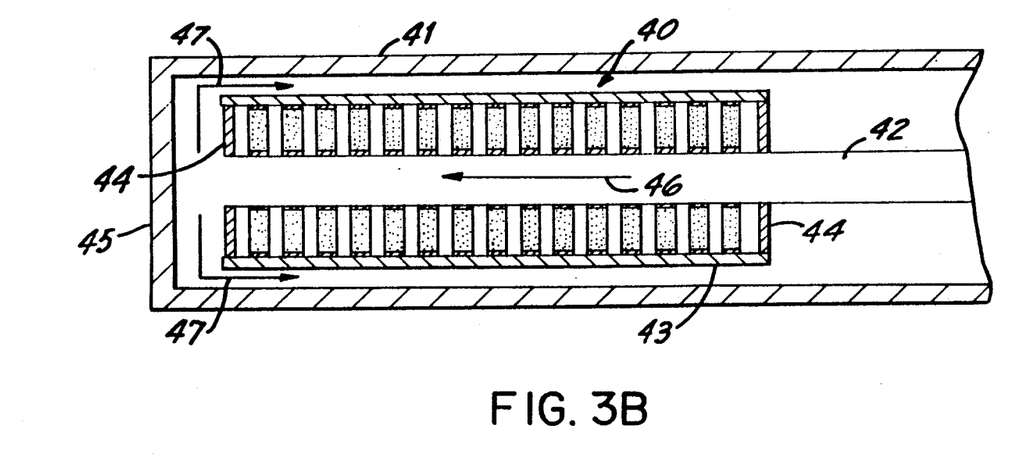

In some applications, it is desired to withdraw large quantities of heat from a small surface, a task not easily achieved with planar thermoelectric cells. In the practice of the instant invention, this can be achieved as described in FIG. 3B. In FIG. 3B a cylindrical refrigerator 40 (the electrical connections are not shown and they can be as in FIG. 3A) is positioned concentrically within a closed end cylindrical structure 41. A heat exchange fluid is pumped through the inner hollow 42 toward the closed end plate 45 (cold plate) of the external cylinder 41 and returns in the space between the bracing structure 43 and the outer cylinder 41. Ring seals 44 are fitted at the opposing ends of the thermoelectric refrigerator 40 to prevent access of the heat exchanging fluid to the thermoelectric cells between the core and the bracing structure. The recirculating pump and the specific plumbing associated with the inner flow and outer flow away from the refrigerator are not shown and these are well known in the prior art, some of these elements are, however, detailed in FIG. 5.

Figure 6D:
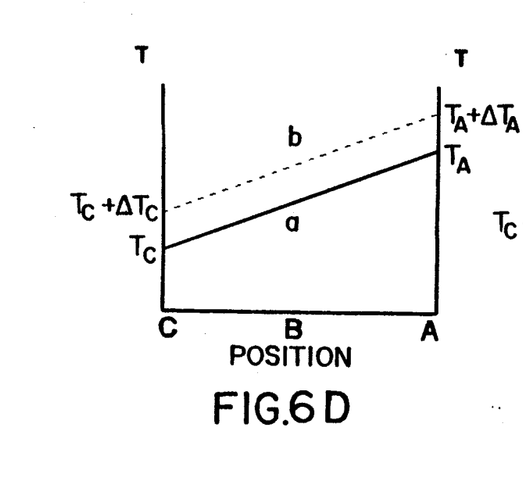
Figure 6E:
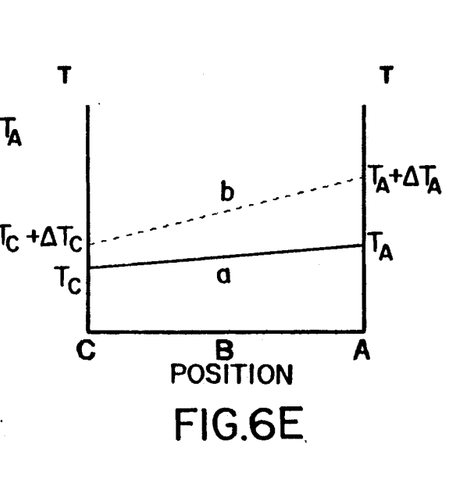
Figure 6F:
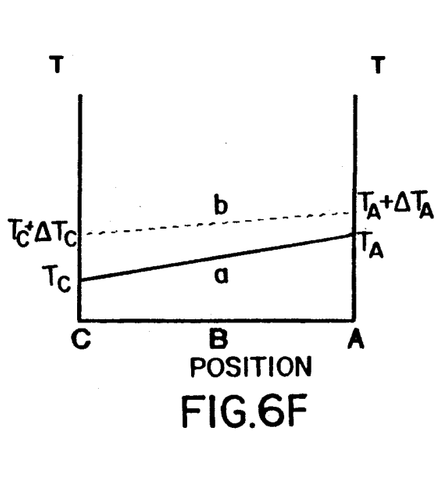

When the power on the device described in FIG. 3B is off, the temperature of the exchange fluid and the end plate 45, ("cold plate") is in equilibrium with the environment. Power is applied to the refrigerator 40 and simultaneously the flow of the recirculating fluid in the direction of the arrows 46 and 47 is started. When looking at a steady state flow of the heat exchanging fluid, a declining temperature gradient is established within the hollow 42. FIG. 3B shows, three planes perpendicular to the main axis of the cylindrical structure, A, B and C respectively. The temperature within the hollow 42 declines from the ambient temperature of the heat exchanger fluid $T_A$ in plane A, through an intermediate lower temperature $T_B$ in plane B to the cold temperature $T_C$, which is also the temperature of the cold plate. In the return path of the heat exchange fluid which is between the bracing structure 43 and the external cylinder 41, a temperature gradient is established increasing in the direction of the heat exchanging fluid flow from $T_C$+Delta $T_C$, to $T_B$+Delta $T_B$ at B to $T_A$+Delta $T_A$ at A. Each Delta T decreases with increasing flow rate of the heat exchanging fluid. When the system reaches steady state, all the Delta T's tend to be equal to each other when the thermoelectric cell's efficiency is temperature independent (for instance with silicon-germanium cells at elevated temperatures or with other materials when $T_A-T_B$ is relatively small). When this is not the case, or if the heat exchanging fluid heat capacity varies strongly with temperature, the designer of a specific application has the freedom to apply different voltages on each cell (see FIG. 4) to compensate for the cells, efficiency which is temperature dependent, or alternately operate all the cells in parallel but allow a location variable Delta T along the tubular structure. Some examples of possible steady state temperature distributions on the device described in FIG. 3B with the heat exchanging fluid at constant flow rates are shown in FIGS. 6D, 6E and 6F. FIG. 6D shows the case where the cells efficiency is temperature independent, and thus the temperature in the core (the solid line a) decreases linearly from the right at ambient or $T_A$ to $T_C$ at the left (also the direction of flow in FIG. 3B). The temperature at the outer periphery, the broken line b, increases linearly as well. FIG. 6E shows the case where the cells' efficiency increases with increasing temperature, and thus the thermal gradient, which is the difference between the core temperature (solid line a) and the peripheral temperature (broken line b), increases as the temperature increases. FIG. 6F shows the case where the cells' efficiency decreases with increasing temperatures and thus the thermal gradient on the cells decreases with increasing temperature. The temperature profiles depicted in FIGS. 6D, 6E and 6F need not necessarily have a linear relationship with the position in the device and the temperature distribution may be any curved but monotonic function.

In any event, the heat extraction rate from the cold plate 45 equals the product of the heat exchanging fluid flow rate by Delta $T_A$ and the heat exchanging fluid heat capacity less the heat losses in the thermoelectric cells (VI or $RI^2$) where V is the voltage applied to each of the thermoelectric cells, I is the current cross each cell and R is the resistance of each cell.

There are two major advantages of the heat exchanger fluid assisted thermoelectric refrigerator of the instant invention over the planar thermoelectric cell technology. The first advantage is that the temperature gradient on each cell is very small. This drastically increases the efficiency of operation of the thermoelectric cell. For instance, a typical thermoelectric module (HP1510-041-261 from Thermoelectron, Waltham, Mass.), when operated with a thermal gradient of 1° C. has a pumping power of 7 Watts, but the same cell when operated with a thermal gradient of 30° C. has a pumping power of only 4 Watts, and at a very large thermal gradient of 60° C. the pumping power declines to under 0.6 Watt. In the device described in FIG. 3B, one may lower the temperature gradient on each element by increasing the flow rate of the heat exchanging fluid, or, by increasing the number of cells, and thus increase drastically the overall efficiency of the thermoelectric coolers. In the prior art, when a relatively large temperature lift is desired, one often resorts to building a cascade of planar thermoelectric modules, however each module needs to have an area larger than the preceding module since subsequent modules in the cascade need to transfer not only the heat from the cold load but also the Joule heat generated in each of the prior modules. The design of the devices of the instant invention allows for scaling up the possible temperature lift by adding cylindrical cells that are all equal in geometry, and each needs to pump only heat from the load and the cell's internally generated Joule losses. The configuration of FIG. 3B, which is essentially a refrigerator with a recuperative heat exchanging medium (namely the temperature distribution in the heat exchanging medium is constant in time), is therefore much more efficient, more versatile and a lower cost solution to thermoelectric cooling then heretofore available.

In summary the different embodiments describe thermoelectric cell consisting of a multiplicity of thermoelectric couples arranged radially. A plurality of such thermoelectric cells when assembled along a single axis create a thermoelectric heat pump, or conversely a thermoelectric generator. Two families of such thermoelectric heat pumps are described. One in which the central core as well as the outer envelope are isothermal with essentially the same thermal gradient along each individual couple within each cell. The other, in which a heat exchanging fluid is used to form a thermal gradient along the core and the outer envelope and the thermal gradient along couples within a cell is small and constant but can vary between couples of adjacent cells.

Figure 4A:
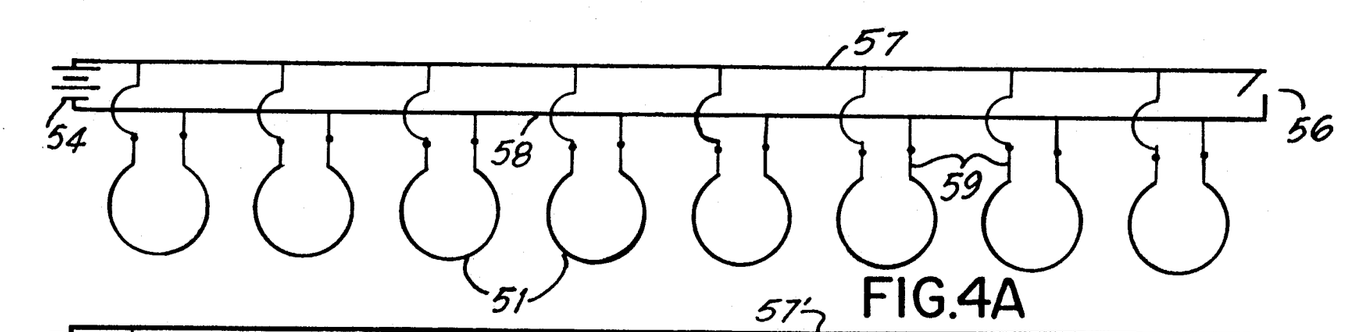
FIGS. 4A, 4B and 4C are wiring schemes for assembling a multitude of cylindrical thermoelectric cells.
Figure 4B:
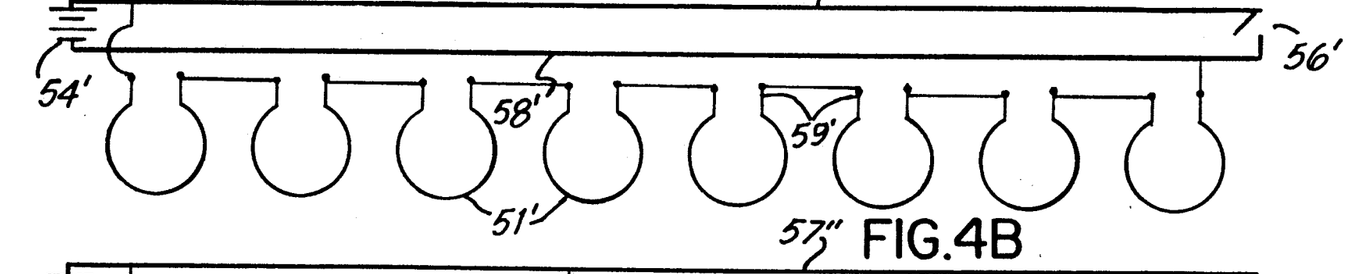
Figure 4C:
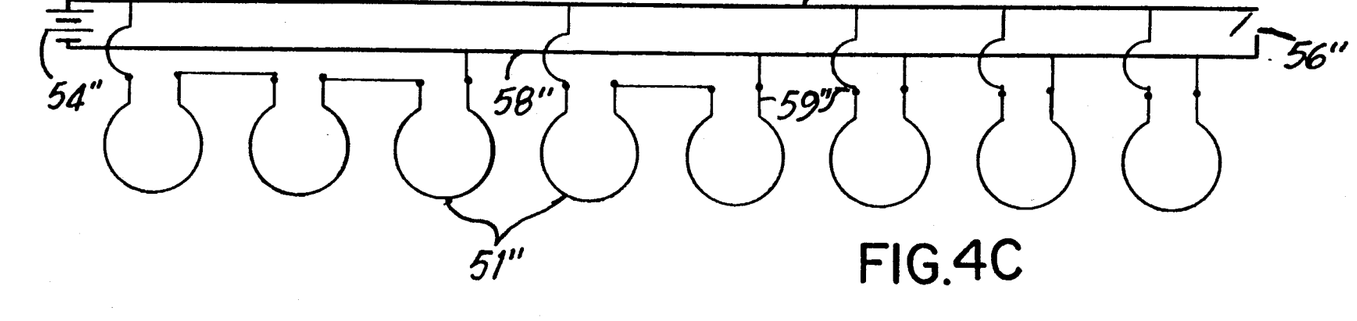

FIG. 4 shows a number of ways to wire the different cylindrical thermoelectric cells in a single thermoelectric refrigerator. Each thermoelectric cylindrical cell, is represented by a circle (51, 51' and 51" for FIGS. 4A, 4B and 4C respectively) terminated by two electrodes (59, 59' and 59" for 4A, 4B and 4C respectively). This symbol represents a unit or a cell as described in FIG. 1.

FIG. 4A shows the standard and preferred parallel wiring, in which opposing electrodes 59 of a single unit are connected to opposing conductors 58 and 57, connecting each unit to the power source 54 directly. The refrigerator is actuated when the switch 56 is closed. This arrangement is particularly useful when all the units should operate at the same temperature and under the same thermal gradient, as in FIG. 3A. The voltage drop on each unit should be the same, and when all the units are of the same compositional and geometrical structure, the current through the units, and thus the heat extraction capacity of all units would be the same. Another advantage of this wiring is that the failure of one unit within the refrigerator will not have a major negative impact on the operation of the total refrigerator.

When the wiring of FIG. 3A is used in a device as described in FIG. 3B it may, sometimes, be desired to use thermoelectric cells within the device with different cross sections or small compositional variations, as the intended median operating temperature of each cell varies, to compensate for the temperature dependence of the thermoelectric cell's efficiency. Within a cylindrical cell, however, all the couples are still compositionally and dimensionally equivalent. The specific configuration depends on the properties of the thermoelectric couples used. The thermal efficiency of a thermoelectric couple is a complex (nonlinear) function of temperature. For instance, the heat pumping efficiency of bismuth telluride based couples decreases with increasing temperature, while that of lead telluride based couples increases with temperature up to about 350° C. and then declines with increasing temperature.

When using the thermoelectric refrigerator described in FIG. 3B, it may sometimes be desired to connect the cells within the refrigerator in series as described in FIG. 4B, or even in a combination of parallel and series as in FIG. 4C. These configurations are given only for completeness of this specification, and it should be understood that a detailed customization of the different cells within a refrigerator is required to operate these configurations efficiently. It is often more effective to forego optimization of operational efficiency and use the parallel wiring for heat exchange fluid assisted refrigerators as described in FIG. 3B and gain lower manufacturing and engineering costs as well as immunity from device failure due to a single cell failure, as would be the case in the wiring schemes of FIGS. 4B and 4C.

Figure 5:
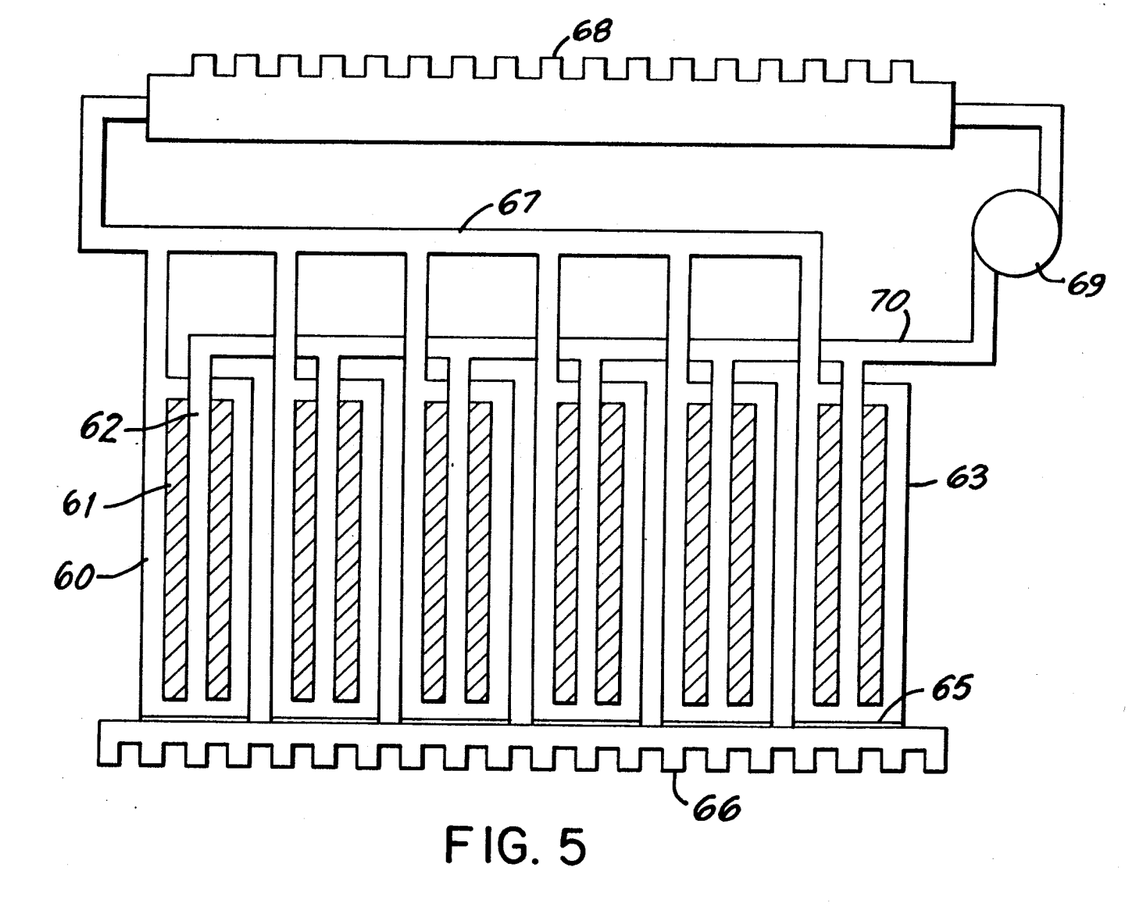
FIG. 5 is a cross-section showing a large scale refrigeration system using the cylindrical devices as described in FIG. 3B.

FIG. 5 shows a large scale thermoelectric refrigeration system built from a multiplicity of units 60 each being essentially as described in FIG. 3B. Each unit 60 has a group 61 of thermoelectric cells mounted on a hollow annular core 62 and enclosed within a cylindrical vessel 63 concentric with the core. Each vessel 63 is terminated with a cold plate 65 in thermal contact with the cold load 66 being refrigerated. A heat exchanging fluid is pumped through the hollow cores 62 toward the cold plates 65 and returns in the space between the group 61 of thermoelectric cells and the outer cylinder 63. The heat exchanging fluid leaving the outer cylinders 63 is directed to a hot heat exchanger 68 via a common conduit 67, where heat is discharged to the ambient environment and recirculated by the pump 69 to a conduit 70 which feeds back the heat exchanging fluid to the hollow cores 62.

In the operation of this refrigerator, the heat exchanging fluid exiting the hot heat exchanger 68 is at ambient temperature, $T_A$. As it flows through the group of thermoelectric cells 61, heat is withdrawn and dumped to the returning heat exchanging fluid flowing in the outer cylinder 63. When the heat exchanger reaches the cold plate its temperature has been lowered to $T_C$. The cold heat exchanger will reach a temperature $T_C$+Delta T, somewhat higher than the cold plate's temperature and thus discharge heat into the heat exchanging fluid within the bottom of the external cylinder 63. As the heat exchanger fluid returns on the hot side of the thermoelectric cells, heat from these cells is continuously added to the heat exchanging fluid and the temperature of the fluid finally reaches a temperature $T_A$+Delta T, which is somewhat higher than ambient. The heat exchanging fluid is now collected through the conduit 67 and led to the hot heat exchanger 68 where it discharges heat to the ambient environment so that its temperature decreases back to the ambient temperature $T_A$.

Since all the thermoelectric cells operate at a small temperature gradient, which is around $(T_A-T_C)/N$, where N is the number of thermoelectric cells within a group 61, the overall efficiency is greatly improved. When planar thermoelectric cells are used, an equivalent temperature lift $(T_A-T_C)$ would require a cascade of N planar cells each with an area progressively larger than the prior cell, or alternatively, a large temperature gradient on few elements in a cascade. The former solution is expensive and limits the heat pumping capacity of the devices, the latter solution results in device efficiency which is 3 to 10 times lower than the devices of the instant invention. In FIG. 5 the external cylinders 63 may be omitted and the hollow elements 61 immersed in a common counterflowing heat exchanging fluid, flowing first through the hollows 62 and returning in the space between the elements in an enclosure common to all elements (see FIG. 7).

Figure 7:
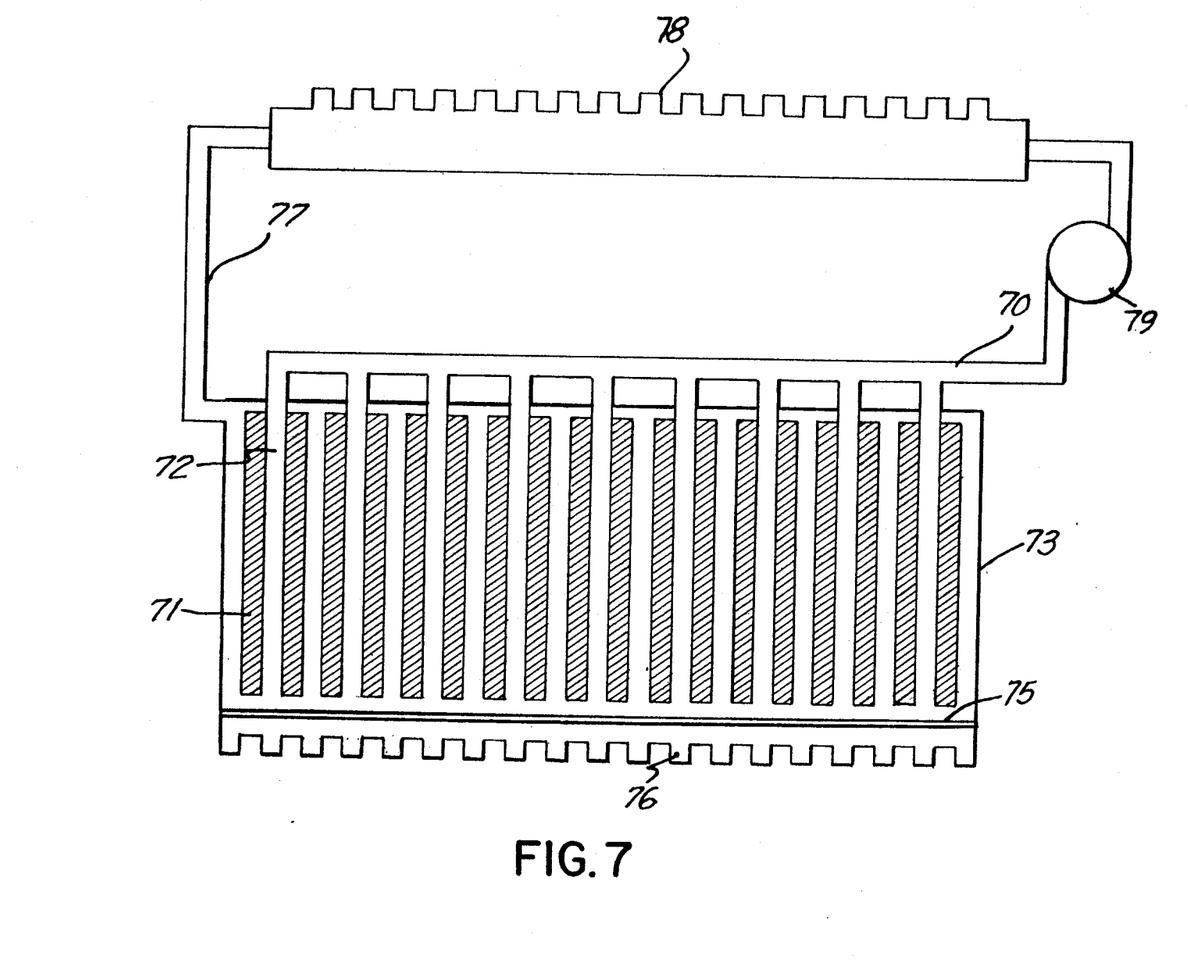
FIG. 7 is a cross-section showing a large scale refrigeration system using the cylindrical devices as described in FIG. 3B.

In the presence of a gravitational field (most earthbound fixed installations) when the heat exchanging fluid is a liquid whose density increases with decreasing temperature, the device described in FIGS. 5 and 7 can be operated without the pump 69. When operated in this mode, the cold plates and cold heat exchanger are positioned on the bottom of the installation and the hot heat exchanger on the top of the installation. A flow of the heat exchanging liquid will be induced by convection and density differences once the thermoelectric cells are powered because as the liquid is cooled within the hollows 62, it will increase in density and tend to sink toward the cold plates, and as the liquid outside the thermoelectric groups 61 is heated it will decrease in density and thus tend to rise toward the hot heat exchanger. The energy for inducing this flow, which is only the energy required to overcome the conduit's induced drag on the fluid and turbulent flow, is supplied by the power supply that activates the thermoelectric cells. After a short time, a steady state situation is set up in the system, causing flow of the heat exchanging liquid in the correct direction and pumping heat from the cold heat exchanger to the hot heat exchanger in a continuous manner.

There are two major advantages of the device described in FIG. 5 relative to the classical compression cycle based refrigerators using chlorofluorocarbon compounds (CFC's or Freons). The first advantage is that the heat exchanging fluid can be any of many low cost unchlorinated and unfluorinated compounds, like water, mixtures of water and glycol, silicone fluids etc., thus reducing the environmental hazard of this refrigeration technology relative to current CFC based compression devices. The second advantage is that the efficiency of the heat pump of the instant invention is only weakly load dependent when the temperature gradient is constant, because the power to the system can be controlled continuously to respond to thermal load changes. In compression cycles, however, the full efficiency of the heat pump is only achieved at full capacity. When lower thermal loads are desired, the heat pump must operate in the on-off mode, often reducing the overall thermodynamic efficiency by a factor of 2. By increasing the number of discrete cells in a given group 61 (FIG. 5) so that the thermal gradient on each cell is drastically decreased, thermal efficiency exceeding the full load thermodynamic efficiency of compression cycle devices may be achieved, particularly when using highly efficient bismuth-telluride based thermoelectric cells near room temperature.

The device described in FIG. 3B can also be used in the extraction of low grade heat, for example from discharge water in power plants. Currently, these waters are cooled prior to discharge in evaporative towers. The technique could involve enclosing the thermoelectric device as in FIG. 3B in an external cylinder, but keeping both the core and the peripheral flows independent. In this application, water at ambient temperature flows from right to left in the core with an ambient entry temperature $T_A$, and the warm water with an entry temperature $T_H>T_A$ flows in the peripheral container in the opposite direction. At optimal steady state flow, the ambient water would heat to $(T_H+T_A)/2$ and the hot water would cool to $(T_H+T_A)/2$, or be recycled with additional fresh water at $T_A$ in a secondary device to extract additional heat in the same manner. Waste water would be discharged only when the temperature difference is too small to efficiently extract additional energy.

Figure 8A:
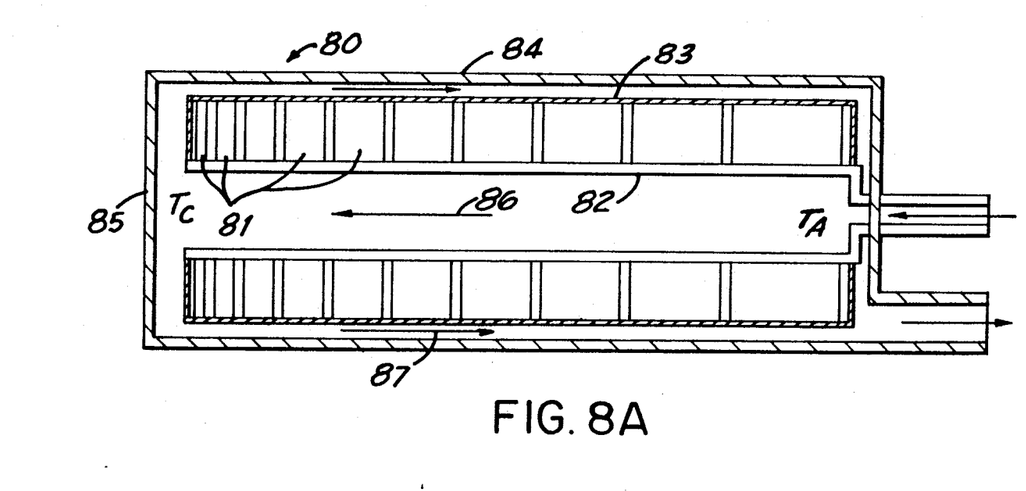
FIGS. 8A and 8B are cross-sectional views of thermoelectric refrigerators similar in some respects to the refrigerators of FIG. 3B.
Figure 8B:
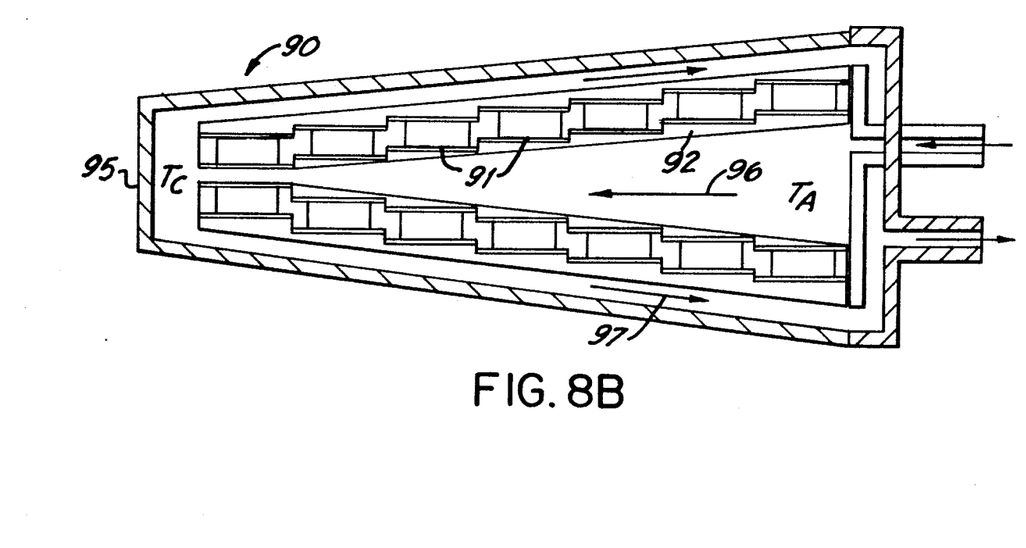

When it is important to optimize as much as possible the thermodynamic efficiency of a recuperative heat exchanger assisted heat pump of the instant invention, one need to take into account the temperature dependence of the efficiency of the thermoelectric cells within the heat pump. In FIG. 3B the cells are shown to be equal in their physical and electrical aspects i.e. same size shape and electrical parameters. Each cell, however, operates at a progressively lower temperature (when going from the right to the left in FIG. 3B). For instance, when $T_A=45°$ C. and $T_C=-20°$ C., and the cells are made of bismuth telluride, the cells efficiency at the high temperature ma be only about half the efficiency at the low temperature. FIGS. 8A and 8B demonstrate two general devices to solve the problems involved with temperature dependent cell efficiency.

FIGS. 8A and 8B show respectively two devices 80 and 90 similar to that described in FIG. 3B, except that the cylindrical thermoelectric cells 81 and 91 are not physically and electrically equivalent (equal) within the device. The thermocouples within each cell are equivalent (thus maintaining the radial symmetry).

Both devices 80 and 90 (in FIGS. 8A and 8B respectively), have a number of thermoelectric cells 81 and 91, which are mounted on their respective inner annular members 82 and 92 and enclosed within their respective outer annular members 83 and 93. The thermoelectric devices are within closed end enclosures (housings) 84 and 94, having each a respective cold plate 85 and 95 at their closed end. A heat exchanging fluid is pumped and flows in the direction of arrows 86 and 96 within the inner member 82, 92 of the devices and returns in the opposing direction 87 and 97 in the space between the outer annular members 83 and 93 and the enclosing housings 84 and 94

In FIG. 8A, as the temperature declines from $T_A$ on the right hot side of the device to $T_C$ on the cold left side of the device, the size of the cells 81, as seen in cross section, declines. As a result the larger cross section cells (on the right) operate at somewhat higher currents than the smaller cross section cells (on the left) thus compensating for the efficiency difference between the cells, and maintaining a similar temperature gradient on all the cells, which is the thermodynamic optimal operational mode of the devices.

In FIG. 8B the problem is solved by using progressively smaller diameter cells 91 in the sequence of cells from the hot zone at $T_A$ (right side) to the cold zone $T_C$ (left side) of the device. All the couples within each cell and between cells are the same (in size and electrically) except that the number of couples per cell 91 progressively decreases as the cells efficiency increases from right to left, due to the progressively smaller diameter of the cells in that direction.

In the heat pump described in FIG. 8A all the cells are connected in parallel, while in the device described in FIG. 8B, the cells are connected in series to assure that the same current passes through all the couples within the heat pump.

In the prior art, generally thermocouples within a thermoelectric cell have a large "aspect ratio", namely the dimension in the direction of heat flow (and current flow) is usually larger than the dimensions of the cross section perpendicular to the direction of heat flow. The reason for that thermocouple aspect ratio is the thermocouple must have a relatively large thermal gradient in the flow direction. In the present invention, in the recuperative heat exchanger assisted refrigerators (for instance FIG. 3B) the thermal gradient on each thermocouple is kept very low (thus increasing the devices thermodynamic efficiency), and therefore, very thin thermocouples with relatively small aspect ratios may be employed.

This feature allows the use of mass manufacturing technology, used to manufacture integrated circuits, which technology has not been practical for thermoelectric devices. In the prior art, the thermocouples' n and p elements are cleaved to size from respective master crystals and assembled (with the help of appropriate jigs and tools) into thermoelectric cells. Since dimensions cannot be made much smaller than 1 mm in the direction of heat flow, mass deposition techniques, which are used in the semiconductor industry, are not used to produce such thermocouple cells. In the thermoelectric cells for recuperative heat exchanger assisted thermoelectric refrigerators of the instant invention, the thickness of the thermocouples is determined generally by the number of radial elements within a device and the total temperature gradient desired. For instance, in a device capable of producing a thermal lift $(T_H-T_C)$ of 50° C., over a length of 10 cm, each ring (cell) has legs that are 25 microns and separated from the other leg in the couple by 3 microns and the adjacent rings are separated by 7 microns (a system with a ring every 60 microns). The thermal gradient on each cell is only 0.03° C. Such a low thermal gradient is supported by a leg dimension in the direction of heat flow of 10 microns. The thickness of each leg is less then 0.5 mm.

The device is formed by, a full sheet which is wrapped around a support inner cylindrical structure (inner annular member), is preferably manufactured in one process having a number of consecutive deposition steps well known in the practice of semiconductor integrated circuit manufacturing.

Figure 9A:
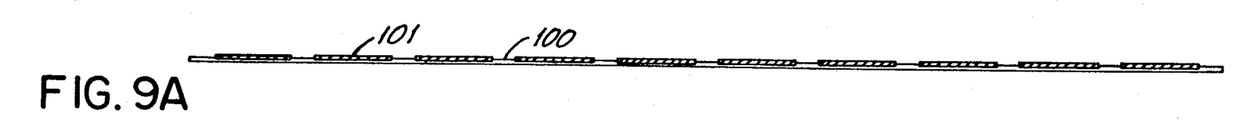
FIGS. 9A-9G are side cross-sectional views of some of the steps in manufacturing a thermoelectric refrigerator using integrated circuit manufacturing technology.
Figure 9B:
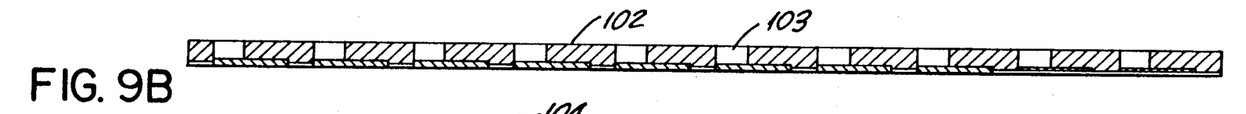
Figure 9C:
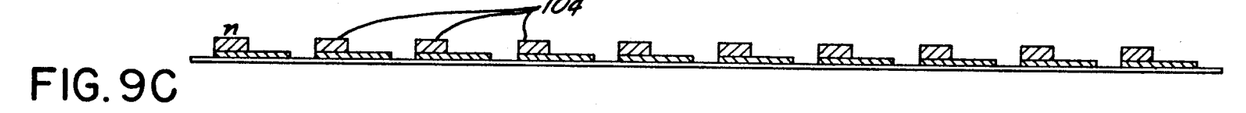
Figure 9D:
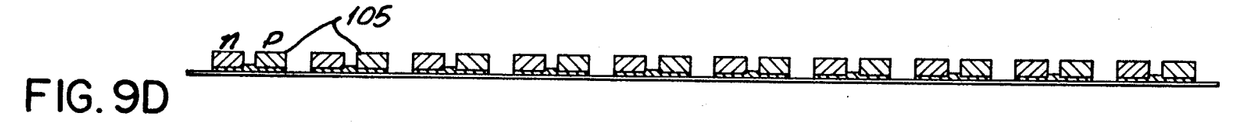
Figure 9E:
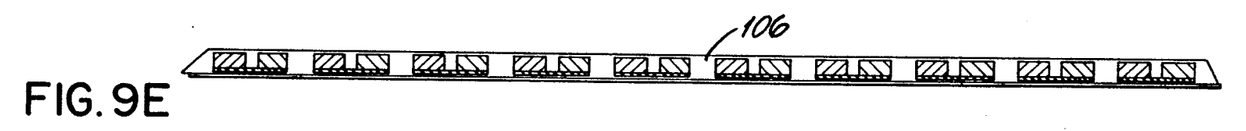
Figure 9F:
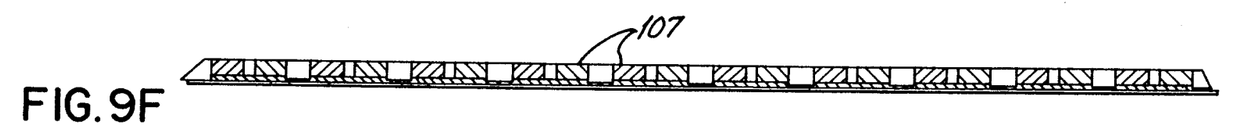
Figure 9G:
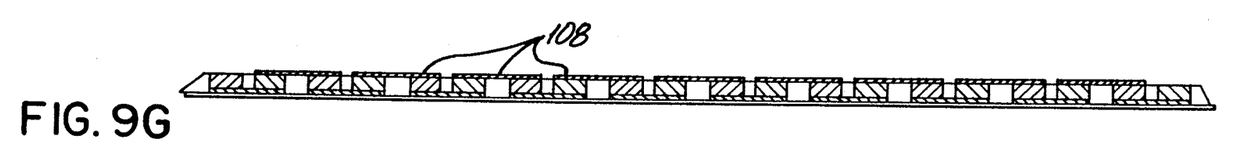

Such an example is depicted in FIGS. 9A to 9G. As shown in FIG. 9A, an appropriate polymeric thin film 100, for instance "Mylar" (Tm of Dow), has deposited on it, through an appropriate screen, all the intracouple conductors 101 (for instance copper or aluminum). There are well known methods in the prior art for such deposition, for example electroless plating and physical vapor deposition. In order to improve subsequent contact of the p and n materials (preferably doped bismuth telluride) on the intracouple conductors 101, bismuth is ion implanted into the intracouple conductors 101. A soluble screen 102 (soluble in water or other appropriate solvents) with holes 103 of the appropriate dimensions (for instance 25 microns by 25 microns) is positioned on a grid (60 microns lattice so that the intracouple distance is 3 microns and the intercouple distance 7 microns). The screen is 10 microns thick and is now positioned on the substrate so that its holes are over the leftmost end of the connector metallizations, as in FIG. 9B. N-type bismuth telluride is vapor deposited through the holes 103 and when the screen 102 is removed there is obtained a structure as described in FIG. 9C, having a lattice of n-type elements 104. It is preferred to vapor deposit a thin film (less than 1 micron) which covers the inner part of the depressions 103 followed by a liquid phase epitaxial growth from a saturated bismuth telluride saturated bismuth alloy to accelerate the depositon step. The steps of FIGS. 9B and 9C repeated for the p type elements 105, as in shown in FIG. 9D. The structure is now back-filled with a flexible polymer 106 which fills all the interelements spaces and covers the top of the elements, as shown in FIG. 9E. In the next step, the excess polymer is removed to the uncover all the tops 107 of the couples' elements, as shown in FIG. 9F and this is followed by depositing the intercouples conductors on the uncovered tops 107 as shown in FIG. 9G.

Many variants on these process steps are well known in the prior art. For instance, one could start with a sheet of photochromic glass 10 microns thick (very flexible at this small thickness) and expose the glass to ultraviolet light through a blocking screen having perforations at the intended areas of the desired network of bismuth telluride elements, which cause (after an appropriate heat treatment) recrystallization in those areas. The network of holes is formed by preferentially etching the recyrstallized phase (a technique used for many years in the manufacture of micro-channel plates). One may fill the network of holes from the liquid phase (bismuth telluride melts at about 570° C.) followed by slective implantation and heat treatment (doping) of alternating rows to obtain the n-type and p-type elements, or fill first the n-type rows and then the p-type rows. Now one heat presses on both sides sieve-like polymeric screens having perforations above the appropriate pairs of elements (on one side intercouples and on the other side intracouple joints). The assembly is then dipped in an electroless copper solution which imparts metallization only through the perforations. This completes the assembly of the network of thermocouples. Since the glass matrix is very thin it is flexible enough to wrap the sheet formed around a cylindrical element (inner annular member) to build the device described in FIG. 3B.

Yet another method, shown in FIGS. 10A–10J may be used to assemble the thermoelectric cells of the present invention, and particularly a device as described in FIG. 8B where all the thermoelectric couples within the device are connected in series.

The method involves the preparation of a long continuous strip of thermocouples connected all in series. To assemble a tubular thermoelectric device, the strip is simply wrapped in a spiral manner on a conical strucutre when a device like that described in FIG. 8B is desired, or on a cylindrical structure, when a device like that described in FIG. 3A is desired. One method of continuous production of the thermoelectric strip is described in FIGS. 10A to 10J.

Figures 10A, 10B, 10C, 10D, 10E, 10F, 10G, 10H, 10I:
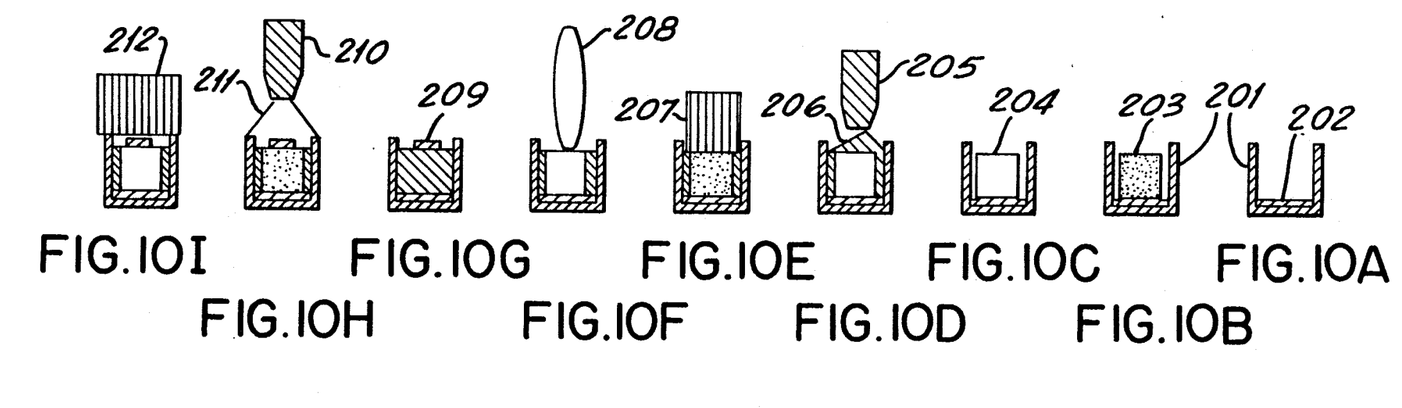
Figure 10J:
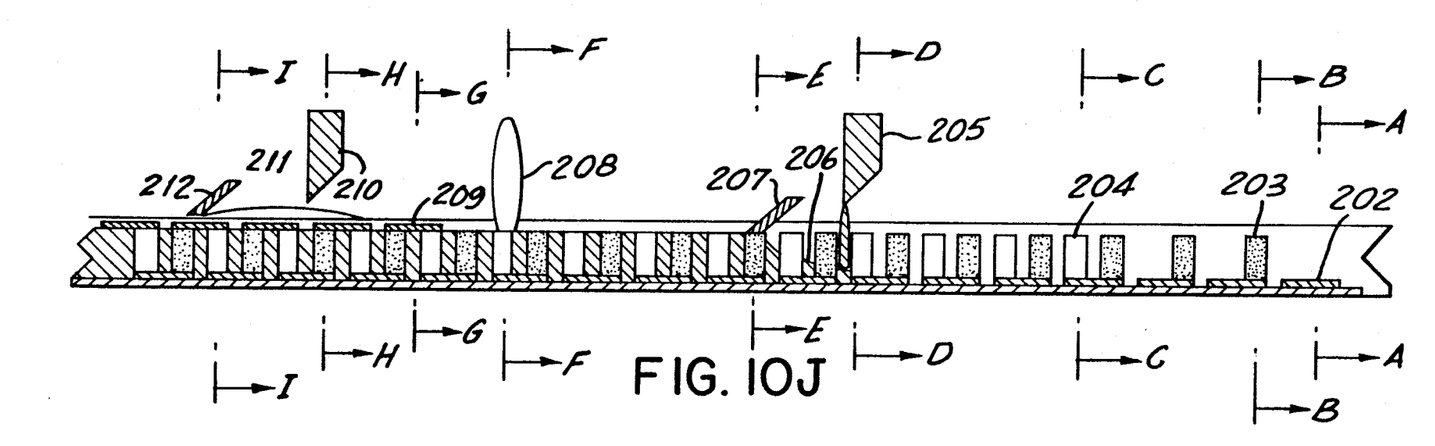
FIG. 10J illustrates steps in an alternative manufacturing process.

FIG. 10J describes the various steps in the manufacture of a strip of thermoelectric cells connected in series. The cross sections 10A through 10I are in the designated planes of 10J and correspond to various assembly steps. FIG. 10J shows a segment of the thermoelectric strip 200, which in this embodiment is made to move either in a continuous manner or in a step manner from left to right in the manufacturing process. The substrate 201 has a rectangular "U" cross section and is made of a thin and flexible polymer. On its inner bottom, metal conductors 202 are deposited, as described above. This can be achieved by electrodepositing through an appropriate screen, or if the assembly is relatively large, the conductor 202 can be thermally embedded in the substrate in as in FIG. 10A. The strip 200 is advanced to a station (FIG. 10B) where the n-type leg 203 of the thermoelectric element is soldered on the right edge of the conductor 202. The strip is further advanced and the p-type leg 204 is soldered on the left side of the conductor 204 (as in FIG. 10C). As the strip further advances it comes under a dispenser 205 as shown in FIG. 10D which fills the gaps between the legs and the substrate enclosure with an appropriate flexible fast setting insulative polymer 206. A blade 207, which can be made of rubber or another complaint material continuously squeeze excess polymer so that only a minimal film residue is left on the top surfaces of the p and n type legs, as shown in FIG. 10E. To assure good electrical contact and good solderability of the top end of the legs, a plasma 208, as shown in FIG. 10F is applied to the surface which etches back any residual polymer 206 from these surfaces. One can of course use many other methods, including a buffing or polishing wheel for that purpose (and thus avoid the need to enclose the process in a partial vacuum). This step is followed by soldering (or depositing) the metal electrode 209 a shown in FIG. 10G on legs of neighboring couples. A second dispenser 210 fills residual space with a felxible polymer, as shown in FIG. 10H and the excess polymer is wiped out by a broad blade 211 as shown in FIG. 10I.

This process is adaptable to full automation and produce continuous long strips of thermoelectric cells connected all in series, which as explained above, can be used in a single layer as cooling (or warming) wrappers around pipes, tubular structures or even structures of variable cross sections.

While we described only few specific applications and designs of the cylindrical thermoelectric cell of the instant invention, other modifications will occur to those skilled in the art without departing significantly from the spirit of the invention and the scope of the claims hereto. For example, the inner tube and outer tube need not be circular rings in cross-section but may be oval, rectangular or polygonal and the fluid need not be liquid but may be air or other gases.

I claim:

1. A thermoelectric system including a thermoelectric device comprising a plurality of thermoelectric cells each cell comprising
   (i) an inner annulus member having an imaginary axis;
   (ii) an outer annulus member coaxial with the inner member and having an inner wall separated from the inner member by an annular space;
   (iii) a plurality of thermocouples positioned in the annular space, each thermocouple comprising a leg of p-semiconductive material and a leg of n-semiconductive material, each leg having two ends and being radially directed relative to said axis, each leg being in thermal contact with the inner annulus member at one of its ends and being electrically connected to the other leg of its thermocouple at the same end, with the p-type leg of one couple connected to the n-type leg of an adjacent couple at the ends nearest the outer annulus member; the cells arranged side-by-side along their axii, the system further comprising a source of DC power electrically connected to each thermocouple of each cell and pump means to flow a continuous stream of liquid through the inner annulus member and to return the same stream of liquid in the opposite direction over the outer annulus member.

2. A thermoelectric device as in claim 1 wherein in each cell the inner member is an electrical insulator and thermal conductor.

3. A thermoelectric device as in claim 1 wherein in each cell the outer member is an electrical insulator and a thermal conductor.

4. A thermoelectric system as in claim 1 wherein the cells are arranged in a sequential order relating to the progressive increase selected from the group of an increase in the size of the thermocouple of the cell and an increase in the number of thermocouples of each cell.

5. The device of claim 1 wherein the cells are connected in parallel to the DC power source.

6. A thermoelectric device as in claim 1 wherein the thermocouples within each cell are electrically connected in series.

7. A thermoelectric recuperative heat exchanging refrigerator comprising a plurality of thermoelectric cells each cell comprising:
(i) an inner annulus member having an imaginary axis;
(ii) an outer annulus member coaxial with the inner member and having an inner wall separated from the inner member by an annular space;
(iii) a plurality of thermocouples positioned in the annular space, each thermocouple comprising a leg of p-semiconductive material and a leg of n-semiconductive material, each leg having two ends and being radially directed relative to said axis, each leg being in thermal contact with the inner annulus member at one of its ends and being electrically connected to the other leg of its thermocouple at the same end, the thermocouples within each cell being connected in series; with the p-type leg of one couple connected to the n-type leg of an adjacent couple at the ends nearest the outer annulus member, and the refrigerator further including DC power means connected to each thermocouple to furnish DC power thereto and pump means to flow liquid in a continuous stream through said inner annulus member and over said outer annulus member; and a housing means to house the cells and a liquid flow space around the outer annulus member, said housing means having at least one closed end in thermal contact with an external heat source from which heat is adapted to be withdrawn and the pump means includes means for pumping the liquid first within the housing means through the inner annulus member and toward the closed heat source and then through the said space around the outer annular member in reverse direction thereby withdrawing heat from the closed end and exuding heat as the liquid runs in said reverse direction along the exterior of the outer annulus member.

8. A thermoelectric refrigerator as in claim 7 wherein the inner member of each cell is a round elongated tube adapted for the flow of fluid therein and outer member is an elongated tube adapted for the flow of fluid thereover and wherein the axii of the cells are aligned along a common axis.

9. The refrigerator of claim 7 wherein the cells are arranged in a sequential order relating to the progressive increase beginning from the closed end of the refrigerator selected from the group of an increase in the size of the thermocouple of the cell and an increase in the number of thermocouples of each cell.

10. The refrigerator of claim 7 wherein the cells are connected in parallel to the DC power source.

11. A thermoelectric generator comprising a plurality of thermoelectric cells each cell comprising
(i) an inner annulus member having an imaginary axis;
(ii) an outer annulus member coaxial with the inner member and having an inner wall separated from the inner member by an annular space;
(iii) a plurality of thermocouples positioned in the annular space, each thermocouple comprising a leg of p-semiconductive material and a leg of n-semiconductive material, each leg having two ends and being radially directed relative to said axis, each leg being in thermal contact with the inner annulus member at one of its ends and being electrically connected to the other leg of its thermocouple at the same end, the thermocouples within each cell being connected in series with the p-type leg of one couple connected to the n-type leg of an adjacent couple at the ends nearest the outer annulus member; the cells arranged side-by-side along their axii in a sequential order relating to the progressive increase selected from the group of an increase in the size of the thermocouple of the cell and an increase in the number of thermocouples of each cell;

and the generator further including DC power utilization means connected to each thermocouple to derive DC power therefrom and pump means to flow liquid in a continuous stream through said inner annular member and over said outer annulus member.

12. A thermoelectric generator as in claim 11 wherein in each cell the inner member is an electrical insulator and a thermal conductor.

13. A thermoelectric generator as in claim 11 wherein in each cell the outer member is an electrical insulator and a thermal conductor.

14. A thermoelectric generator as in claim 11 wherein the inner member of each cell is a round elongated tube adapted for the flow of fluid therein and the outer member is an elongated tube adapted for the flow of fluid thereover and wherein the axii of the cells are aligned along a common axis.

15. A thermoelectric generator as in claim 11, further including thermal gradient means to apply a radial thermal gradient between the inner and outer members of each cell to generate an electrical potential power from said device and further including means connected to the device to utilize the power generated from the device.

16. A thermoelectric generator as in claim 11 and further including a housing means to house the cells and a fluid-flow space around the cells.

* * * * *